310-11 SR CROSS REFERENCE SEARCH ROOM
FIP8502 XR 3,288,070

Nov. 29, 1966 M. A. PERLOW ET AL 3,288,070

THERMOELECTRIC PUMP

Filed Feb. 18, 1964 2 Sheets-Sheet 1

INVENTORS
MILTON A. PERLOW
BY HERMAN M. DIECKAMP
Gerald E. Koris
ATTORNEY

INVENTORS
MILTON A. PERLOW
BY HERMAN M. DIECKAMP
Gerald A. Koris
ATTORNEY

United States Patent Office 3,288,070

Patented Nov. 29, 1966

3,288,070
THERMOELECTRIC PUMP

Milton A. Perlow, Woodland Hills, and Herman M. Dieckamp, Canoga Park, Calif., assignors to North American Aviation, Inc.

Filed Feb. 18, 1964, Ser. No. 345,718
10 Claims. (Cl. 103—1)

The present invention relates to a thermoelectric pump, and more particularly to an improved thermoelectric pump for electrically conducting liquids such as liquid metals.

A thermoelectrically energized pump is particularly useful for certain applications in remote locations or in space vehicle environments, for example in a nuclear reactor power system in a space vehicle. Such a pump should be lightweight and compact in size and have high reliability for long periods of unattended operation. One such thermoelectric pump is disclosed in U.S. Patent 3,116,693 "Thermoelectric Pump," Sol R. Rocklin, assigned to the same assignee as the present application. While this pump is generally satisfactory, there are certain limitations in its design. For example, the stainless steel duct for the conducting fluid is contiguous with the thermoelectric material. Differential thermal expansion of this duct and the outer copper radiator creates tensile forces which may damage the thermoelectric material. Most thermoelectric materials with high figures of merit such as lead telluride are very fragile, and their mounting in a system is of primary importance. It is found that thermoelectric materials display better mechanical properties under compressive loading. Further, positioning the fluid duct next to the thermoelectric material creates risk of thermoelectric poisoning due to diffusion of chromium or other constituents of alloy steel. There is also a single electrical loop in this design, and failure thereof would stop the pump.

An object of the present invention, therefore, is to provide an improved thermoelectric pump for electrically conducting liquids.

Another object is to provide such a pump having means for distributing a compressive load over the thermoelectric material.

Another object is to provide a thermoelectric pump having parallel electrical circuits.

Still another object is to provide a thermoelectric pump of increased power output per unit length and weight of pump.

Still another object is to separate the thermoelectric material from the pump duct with minimum heat loss.

A further object is to provide such a pump having high mechanical vibration and shock resistance.

Other objects and advantages of the present invention will become apparent from the following detailed description taken together with the attached drawings and the appended claims.

In the present invention the thermoelectric materials are spaced from the fluid duct by a conducting electrode to reduce high shear forces brought on by differential thermal expansion of the duct and radiator; this also prevents poisoning of the material by alloy constituents. The thermoelectric materials are moreover placed under compressive loading. Dual electric circuits are provided which increase the power output and reliability of the system. Heat rejecting fins further serve to complete the electrical circuit of the system. The result of this interrelated physical configuration is a compact pump of high reliability and integrity.

Figures 1, 2:
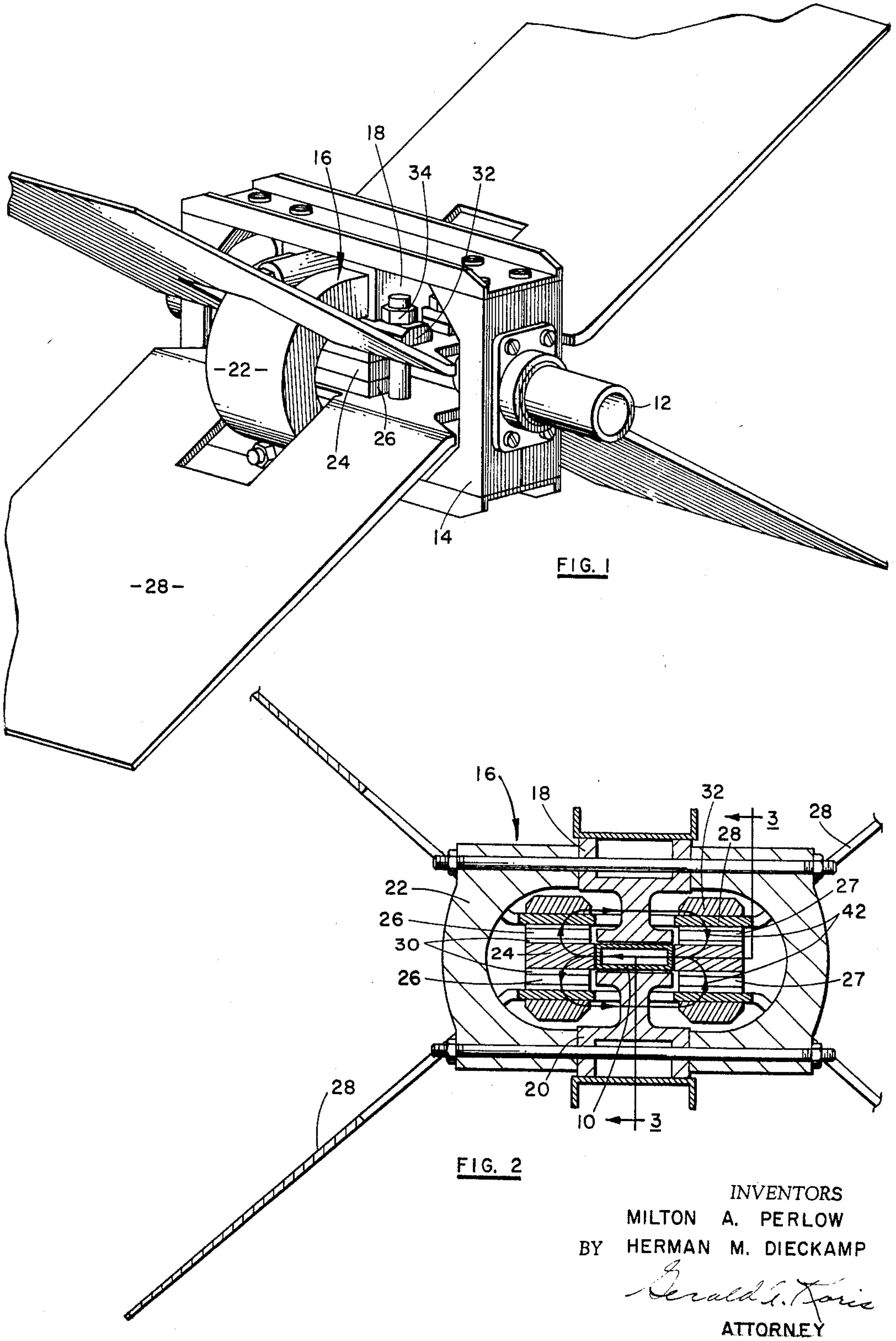
FIG. 1 is a perspective view of the pump.
FIG. 2 is a vertical cross section.

Referring now to FIGS. 1 and 2, the preferred embodiment of the present invention comprises a metallic pumping section or duct 10, preferably of stainless steel or of a nickel, chromium, or cobalt base alloy such as the Hastelloy series. The duct section is preferably rectangular in cross section to accommodate more readily the surrounding structure. It adapts to round inlet and outlet nozzles 12 held by the pump frame 14. The magnet structure 16 is positioned in the center region of the pump. The north 18 and south 20 pole faces of the magnet assembly are positioned on opposite sides of the pumping duct and run the length of the pump. C-shaped magnets 22 complete the magnetic flux circuit.

On both sides of the duct opposite the pole faces is an electrode member 24 of a good heat and electrical conducting material, such as copper. A pair of P-type thermoelectric materials 26 is positioned on both sides of one electrode 24 and a pair of N-type materials 27 on the other electrode 24. The electrodes 24 serve a number of functions: they conduct heat from the fluid in the duct to the thermoelectric materials, complete two parallel electrical systems, and protect the thermoelectrics from shear forces from duct expansion. The parallel electrical circuits are of considerable importance in providing greater reliability and greater unit power. In the event of failure of one of the parallel loops, approximately 70% of the fluid flow would still be maintained, since fluid velocity is proportional to the cube root of the power. The thermoelectric material may be of the metallic or semiconducting type known to the art, for example Cr-Const, Pb-Te, Ge-Si, or other similar materials.

As seen in FIG. 2, the thermoelectric material is separated from the copper electrode and from the heat rejection fins 28 with cover plates 30. The cover plates, preferably of copper, serve a protective purpose during handling and pre-assembly measurements of the very fragile thermoelectric material. Fins 28, of a good conducting metal such as aluminum, reject the heat from the system and provide the temperature differential across the thermoelectric material which is necessary for the generation of a voltage. The fins further serve to complete the electrical circuit of the system.

Figure 3:
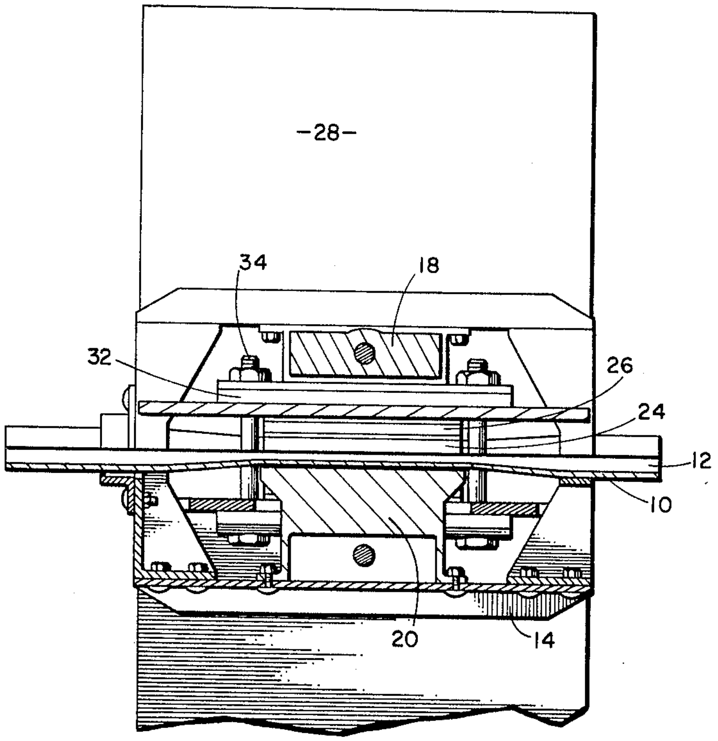
FIG. 3 is a side elevation view.
Figure 4:
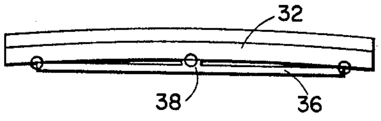
FIG. 4 is a schematic diagram of a beam loading arrangement.

The thermoelectric materials are placed in compression with bars 32 which run the length of the thermoelectric materials, as seen in FIG. 3. These bars, such as of iron, are held in place and provide compressive loading through the use of bolts 34. In order to provide uniform loading of the thermoelectric material, and prevent cracks of the fragile material at the ends where the bolts are positioned, an intermediate spacer bar 36 (FIG. 4) is provided to more uniformly distribute the load. This bar has an outwardly extending ridge 38 at its center, thereby providing points of contact with the center of the outer compression member as well as at the outer ends.

Figure 5:
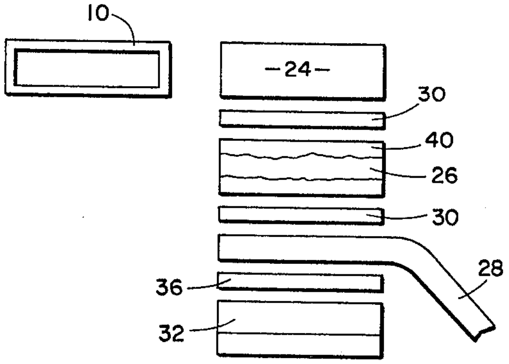
FIG. 5 is a schematic diagram of the stacking configuration of the thermoelectric material and associated components.

FIG. 5 shows the stacking of the various elements in enlarged detail. Thermoelectric material 26 has an outer covering of iron powder 40 compacted thereto, which is chemically compatible with thermoelectric materials such as PbTe, and serves to prevent diffusion of copper or other metals therein. Copper cover plates 30 are diffusion bonded to the compact by such means as heating in vacuum, for example at 1100° F. for 5 hours. The copper electrode 24 is bonded to duct 10 and to the thermoelectric assembly with braze materials known to the art, for example brazes having the compositions 61½% Au, 24% Cu, and 14½% In; and 81½% Au, 16½% Cu, and 2% Ni. The aluminum radiator 28 may be attached to the thermoelectric assembly by such means as vacuum diffusion bonding at elevated temperatures, for instance 990° F. for 5 hours. Spacer bar 36 and compression bar 32 are positioned on radiator 28.

The operation of the present pump follows the basic Faraday law wherein an applied magnetic field perpendicular to a generated current results in a mutually perpendicular force which manifests itself as pressure. The required electrical energy is obtained by converting the thermal energy in the conducting liquid passing through the duct into electrical energy by means of the thermoelectric materials. The hot junction of the thermoelectric material is the region adjacent the copper electrode, while the region adjacent the fin is at a lower temperature and represents the cold junction. This temperature difference results in a voltage which causes current to flow from the N-type material through the electrode, the wall of the throat, the conducting liquid (a liquid metal such as sodium), the opposite wall of the throat, the P-type material, and to return to the N-type material through the external fin, as shown by the circuit identified by reference numeral 42 in FIG. 2. This current interacts with the magnetic field to produce a mutually perpendicular force which manifests itself as a pressure in the liquid metal and produces the pumping action.

The following table gives the characteristics of a preferred embodiment of the present pump.

TABLE I

| | |
|---|---|
| Weight (including magnet) | 20 lbs. |
| Length (throat section) | 3 in. |
| Height (including radiator) | 10 in. |
| Width (including radiator) | 16 in. |
| Thermoelectric material | "N"-PbTe, "P"-PbSnTe. |
| Thermoelectric material thickness | 0.1 in. |
| Throat size (cross section) | 0.4 in. x 1.0 in. |
| Throat material | Stainless steel–347. |
| Channel wall thickness | 0.02 in. |
| ΔP—pressure rise | 1.1 p.s.i. |
| Flow rate | 15 g.p.m. |
| ΔT | 300° F. |
| Radiator material | Aluminum. |
| Magnet material | Alnico V. |
| Magnetic field strength | 15,500 lines/IR$^2$. |
| Compression bar material | Inconel 718. |
| Compression thermoelectric loading | ~1000 p.s.i. |

Pumps of the above design have successfully operated at 1000° F., rejecting heat to a 100° F. sink in a vacuum. The pump section converts electrical energy to hydraulic power at an efficiency of 40%. The thermoelectric energy efficiencies have varied from 2.5 to 3.0%, resulting in an over-all device efficiency of 1.0–1.2%. A total of 27,000 successful test hours have been logged. Thermal cycles from 100–1000° F. at a rate of 5° F. per second have been survived. The pumps have also successfully withstood vibration, shock, and acceleration tests with loads normally encountered in space vehicles.

While the foregoing describes the preferred embodiment of the present invention, it is apparent that other modifications may be made by those skilled in the art. Therefore, the present invention should be understood to be limited only in the manner indicated by the appended claims.

We claim:

1. A thermoelectric pump comprising in combination:

(a) a duct for passing an electrically conducting fluid, (b) at least one pair of associated thermoelectrically dissimilar electric elements spaced from said duct, (c) means for providing an electrical current path between said thermoelectric elements across said duct, (d) said current path means including conductor members contacting said duct and said thermoelectric elements, (e) means for generating a magnetic field across said duct normal to said electrical current, (f) means for holding said thermoelectric members in compression, and (g) heat rejection means connected to respective cold junctions of associated ones of said thermoelectric materials,

2. A thermoelectric pump comprising in combination:

(a) a duct for passing an electrically conducting fluid, (b) at least one pair of conductor members extending along and contacting said duct on opposite sides thereof, (c) at least one pair of associated thermoelectrically dissimilar materials, spaced from said duct and contacting said conductor members, (d) means for compressively loading said thermoelectric materials, (e) magnet means for generating a magnetic field across said duct, said means positioned on opposite sides of said duct and adjacent to said conductor members, (f) means for providing an electrical current path between said thermoelectric materials across said duct normal to said magnetic field, said means including said conductors members, and (g) heat rejection means connected to respective cold junctions of associated ones of said thermoelectric materials.

3. The pump of claim 2 wherein said compression means include bars positioned along the length of said thermoelectric materials.

4. The pump of claim 2 wherein at least two associated pairs of thermoelectrically dissimilar materials are positioned on both sides of said conductor members to provide at least two parallel electrical circuits.

5. The pump of claim 2 wherein said electric current path means include said heat rejection means.

6. The pump of claim 2 wherein said compression means comprise load distributing spacer members extending along and in contact with the sides of said thermoelectric materials opposite the sides thereof in contact with said conductor members, compression bars disposed upon said spacer members, and fastener means connecting associated pairs of said bars.

7. A thermoelectric pump for electrically conducting liquids comprising in combination:

(a) a generally rectangular duct, (b) permanent magnet means positioned along one set of opposite sides of the duct to generate a magnetic field thereacross, (c) conductor members extending along and contacting the other set of opposite sides of said duct, (d) respective pairs of N-type thermoelectric elements connected to both sides of one of said conductor members and P-type thermoelectric elements connected to both sides of the other said conductor member, (e) fins for heat rejection connected to the outer sides of said thermoelectric materials, said fins connecting opposite N-type and P-type materials to complete parallel electric current paths therebetween normal to the magnetic field, (f) compression bar members positioned on said fins extending parallel said thermoelectric materials, and (g) fastening means connecting said bar members.

8. The pump of claim 7 wherein intermediate spacer members adapted to uniformly distribute the compressive load are positioned between said bar members and fins.

9. The pump of claim 7 wherein the conductor members are copper, and the thermoelectric materials have copper cover plates on both sides thereof.

10. The pump of claim 7 wherein the thermoelectric materials are lead telluride with a surface coating of an iron diffusion barrier.

References Cited by the Examiner

UNITED STATES PATENTS

| | | | |
|---|---|---|---|
| 2,748,710 | 6/1956 | Vandenberg | 103—1 |
| 2,881,594 | 4/1959 | Hopkins | 103—1 |
| 2,919,356 | 12/1959 | Fry | 103—1 |
| 3,088,411 | 5/1963 | Schmidt | 103—1 |

LAURENCE V. EFNER, *Primary Examiner.*